US009612300B2

(12) United States Patent
Sharma et al.

(10) Patent No.: US 9,612,300 B2
(45) Date of Patent: Apr. 4, 2017

(54) SYSTEM AND METHOD FOR OBJECT-BASED INITIALIZATION OF MAGNETIC FIELD INHOMOGENEITY IN MAGNETIC RESONANCE IMAGING

(71) Applicant: Wisconsin Alumni Research Foundation, Madison, WI (US)

(72) Inventors: Samir Dev Sharma, Madison, WI (US); Nathan Samuel Artz, Sun Prairie, WI (US); Scott Brian Reeder, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 677 days.

(21) Appl. No.: 14/089,376

(22) Filed: Nov. 25, 2013

(65) Prior Publication Data

US 2015/0145514 A1     May 28, 2015

(51) Int. Cl.
*G01R 33/24*      (2006.01)
*G01R 33/48*      (2006.01)

(52) U.S. Cl.
CPC ....... *G01R 33/243* (2013.01); *G01R 33/4828* (2013.01)

(58) Field of Classification Search
CPC .......................... G01R 33/243; G01R 33/4828
See application file for complete search history.

(56) References Cited

U.S. PATENT DOCUMENTS

| | | | | |
|---|---|---|---|---|
| 8,886,283 | B1* | 11/2014 | Chen | 382/128 |
| 2012/0268121 | A1* | 10/2012 | Hernando | G01R 33/56563 324/309 |
| 2013/0102879 | A1* | 4/2013 | Maclaren | G01R 33/243 600/411 |
| 2014/0142417 | A1* | 5/2014 | Reeder | A61B 5/055 600/420 |
| 2014/0219533 | A1* | 8/2014 | Sato | A61B 5/055 382/131 |
| 2015/0002148 | A1* | 1/2015 | Liu | A61B 5/055 324/309 |

OTHER PUBLICATIONS

Abstract and figures of reference Bakker et al. (EP Pub No. 2,518,523 A1 ); Pub date Oct. 31, 2012.*

(Continued)

*Primary Examiner* — Rodney Bonnette
(74) *Attorney, Agent, or Firm* — Quarles & Brady, LLP (57) ABSTRACT

An object-based approach is used to initialize the magnetic field inhomogeneity estimation for chemical species separation, such as water-fat separation, and other imaging applications. For example, a susceptibility distribution in the subject being imaged is estimated from images reconstructed from single-echo or multi-echo k-space data and used to initialize the magnetic field inhomogeneity estimation. This approach can be applied to any complex-based chemical shift encoded chemical species separation technique and to other imaging applications, such as susceptibility-weighted imaging and quantitative susceptibility mapping. The field map can also be used to correct for image distortions and to generate magnetic field shimming values.

87 Claims, 2 Drawing Sheets

(56) References Cited

OTHER PUBLICATIONS

Berglund, et al., Three-Point Method Enables Whole-Body Water and Fat Imaging of Obese Subjects, Magnetic Resonance in Medicine, 2010, 63(6):1659-1668.

Berglund, et al., Two-Point Dixon Method With Flexible Echo Times, Magnetic Resonance in Medicin, 2011, 65(4):994-1004.

De Rochefort, et al., Quantitative Susceptibility Map Reconstruction from MR Phase Data Using Bayesian Regularization: Validation and Application to Brain Imaging, Magnetic Resonance in Medicine, 2010 63(1):194-206.

Dixon, Simple Proton Spectroscopic Imaging, Radiology, 1984, 53:189-194.

Doneva, et al. Compressed Sensing for Chemical Shift-Based Water-Fat Separation, Magnetic Resonance in Medicine, 2010, 64:1749-1759.

Eggers, et al., Dual-Echo Dixon Imaging With Flexible Choice of Echo Times, Magnetic Resonance in Medicine, 2011, 65:96-107.

Glover, et al., Three-Point Dixon Technique for True Water/Fat Decomposition with B0 Inhomogeneity Correction, Magnetic Resonance in Medicine, 1991, 18(2):371-383.

Haacke, et al., Susceptibility Weighted Imaging (SWI), Magnetic Resonance in Medicine, 2004, 52:612-618.

Hernando, et al., Joint Estimation of Water/Fat Images and Field Inhomogeneity Map, Magnetic Resonance in Medicine, 2008, 59:571-580.

Hernando, et al., Robust Water/Fat Separation in the Presence of Large Field Inhomogeneities Using a Graph Cut Algorithm, Magnetic Resonance in Medicine, 2010, 63:79-90.

Hopkins, et al., Magnetic Susceptibility Measurement of Insoluble Solids by NMR: Magnetic Susceptibility of Bone, Magnetic Resonance in Medicine, 1997, 37(4):494-500.

Jacob, et al., Algebraic Decomposition of Fat and Water in MRI, IEEE Transactions on Medical Imaging, 2009, 28(2):173-184.

Koch, et al., Rapid Calculations of Susceptibility-Induced Magnetostatic Field Perturbations for In Vivo Magnetic Resonance, Physics in Medicine and Biology, 2006, 51:6381-6402.

Lu, et al., Multiresolution Field Map Estimation Using Golden Section Search for Water-Fat Separation, Magnetic Resonance in Medicine, 2008, 60(1):236-244.

Ma, Breath-Hold Water and Fat Imaging Using a Dual-Echo Two-Point Dixon Technique with an Efficient and Robust Phase-Correction Algorithm, Magnetic Resonance in Medicine, 2004, 52(2):415-419.

Reeder, et al., Multicoil Dixon Chemical Species Separation With an Iterative Least-Squares Estimation Method, Magnetic Resonance in Medicine, 2004, 51:35-45.

Schenck, The Role of Magnetic Susceptibility in Magnetic Resonance Imaging: MRI Magnetic Compatibility of the First and Second Kinds, Med. Phys., 1996, 23(6):815-850.

Sharma, et al., Accelerated Water-Fat Imaging Using Restricted Subspace Field Map Estimation and Compressed Sensing, Magnetic Resonance in Medicine, 2012, 67(3):650-659.

Tsao, et al., Hierarchical Ideal: Fast, Robust and Multiresolution Separation of Multiple Chemical Species from Multiple Echo Times, Magnetic Resonance in Medicine, 2013, 70(1):155-159.

Xiang, et al., Water-Fat Imaging with Direct Phase Encoding, JMRI, 1997, 7:1002-1015.

Xiang, Two-Point Water-Fat Imaging With Partially-Opposed-Phase (POP) Acquisition: An Asymmetric Dixon Method, Magnetic Resonance in Medicine, 2006, 56:572-584.

Yu, et al., Field Map Estimation with a Region Growing Scheme for Iterative 3-Point Water-Fat Decomposition, Magnetic Resonance in Medicine, 2005, 54:1032-1039.

Yu, et al., Single Acquisition Water-Fat Separation: Feasibility Study for Dynamic Imaging, Magnetic Resonance in Medicine, 2006, 55:413-422.

Yu, et al., Multiecho Reconstruction for Simultaneous Water-Fat Decomposition and T2 Estimation, Journal of Magnetic Resonance Imaging, 2007, 26:1153-1161.

Yu, et al., Multi-Echo Water-Fat Separation and Simultaneous R2 Estimation with Multi-Frequency Fat Spectrum Modeling, Magnetic Resonance in Medicine, 2008, 60(5):1122-1134.

Yu, et al., Robust Multipoint Water-Fat Separation Using Fat Likelihood Analysis, Magnetic Resonance in Medicine, 2012, 67(4):1065-1076.

* cited by examiner

SYSTEM AND METHOD FOR OBJECT-BASED INITIALIZATION OF MAGNETIC FIELD INHOMOGENEITY IN MAGNETIC RESONANCE IMAGING

STATEMENT REGARDING FEDERALLY SPONSORED RESEARCH

This invention was made with government support under DK083380 and DK088925 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for performing chemical species separation, such as water-fat separation, using an MRI system.

Chemical shift encoded techniques for water-fat separation have experienced considerable development and application in recent decades. Originally proposed by W. T. Dixon in "Simple proton spectroscopic imaging," *Radiology*, 1984; 153(1):189-194, and subsequently expanded by G. Glover and E. Schneider in "Three-point Dixon technique for true water/fat decomposition with $B_0$ inhomogeneity correction," *Magnetic Resonance in Medicine*, 1991; 18(2):371-383, these techniques have been adopted by applications that require improved visualization of water-based tissues as well as those that demand robust fat suppression in areas of severe $B_0$ field inhomogeneity. In addition, the use of chemical shift encoding in $T_1$-weighted contrast enhanced imaging is particularly important because short $T_1$ inversion recovery ("STIR") techniques are incompatible with post-contrast $T_1$-weighted imaging. A variety of water-fat separation techniques have been proposed, including a single-echo method, dual-echo methods, and numerous methods that utilize three or more echoes.

A significant challenge in complex-based water-fat separation is accurate estimation of the $B_0$ field because the least-squares cost is a non-linear and non-convex function of the $B_0$ field map. If the $B_0$ field map is estimated accurately, then the water and fat signals can be separated using a straightforward linear inversion. However, inaccurate estimation of the $B_0$ field map can lead to "swaps" of the water and fat signals. This is a commonly recognized challenge for chemical shift encoded water-fat separation methods.

Accurately estimating the $B_0$ field map has been a major focus of technical development in water-fat separation. Many techniques assume that the $B_0$ field is slowly varying. Although this assumption is empirically based, it is sufficiently valid in many cases, which explains the effectiveness of these techniques. However, none of these methods use any anatomical information or other geometrically based information to aid in the determination of the $B_0$ field map. Recent work from H. Yu, et al., described in "Robust multipoint water-fat separation using fat likelihood analysis," *Magnetic Resonance in Medicine*, 2012; 67(4):1065-1076 has exploited the material properties of tissue by exploiting spectral complexity of fat to minimize water-fat swaps.

Despite the relatively successful performance of most techniques, water-fat swaps still occur. This is especially true in spatial regions where the $B_0$ field varies rapidly because the common assumption of a slowly varying $B_0$ field becomes invalid. Furthermore, images with discontinuous regions of tissue separated by air or low signal are also prone to water-fat swapping since region growing methods aimed at estimating the $B_0$ field map are unable to interpolate field map estimates accurately across regions of noise.

It would therefore be desirable to provide systems and methods for producing a more robust estimate of the $B_0$ field map that overcomes the drawbacks mentioned above, such that accuracy of chemical species separation and other imaging methods that make use of a $B_0$ field map estimate can be improved.

SUMMARY OF THE INVENTION

The present invention overcomes the aforementioned drawbacks by providing a method for performing chemical species separation using a magnetic resonance imaging ("MRI") system, in which a more accurate, object-based initial estimate of a magnetic field map is used during the chemical species separation.

The MRI system is used to acquire k-space data from an imaging volume at a plurality of different echo times, and an image is reconstructed for each of the plurality of echo times using the k-space data acquired at the respective echo time. A distribution of magnetic susceptibility values in the imaging volume is then estimated using information in the reconstructed images, and a magnetic field inhomogeneity map is estimated from the distribution of magnetic susceptibility values. A chemical species separation, such as a water-fat separation, can then be performed using the estimated magnetic field inhomogeneity map.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here are systems and methods for chemical species separation magnetic resonance imaging ("MRI") in which an object-based initialization of the $B_0$ field map is used to improve the separation of signal contributions for different chemical species. This object-based initialization is based on an approximation of the magnetic susceptibility, $\chi$, distribution in the subject being imaged. This approach is intended to augment, rather than to replace, existing techniques for chemical shift encoded chemical species separations, such as water-fat separation. The proposed approach can be applied to any complex-based chemical species separation technique to improve the robustness of the technique. Further, by improving the initial estimate of the field map, present invention is capable of reducing the computational burden associated with estimation of the $B_0$ field map.

The signal from a voxel containing water, $\rho_w$, and fat, $\rho_f$, experiencing a local $B_0$ field inhomogeneity, $\psi$, measured at echo time, $t_n$, can be written, $$s(t_n) = (\rho_w + c_n \rho_f) e^{j2\pi\psi t_n} + N \qquad (1)$$

where $$c_n \sum_{p=1}^{P} \alpha_p e^{j2\pi \Delta f_p t_n} \qquad (2)$$

represents a multi-peak fat spectrum, where $\alpha_p$ is the relative amplitude of the $p^{th}$ fat peak, such that $$\sum_{p=1}^{P} \alpha_p = 1;$$

$\Delta f$ is the frequency shift, in Hertz, of the $p^{th}$ fat peak relative to the water peak; and N denotes complex additive white Gaussian noise ("AWGN"). The effects of $T_2^*$ have been ignored because they do not generally affect the quality of water-fat separation; however, it should be noted that the methods described here can also be applied to methods using $T_2^*$.

Separating water and fat requires the estimation of the unknown parameters from the multi-echo measurements. In the presence of AWGN, the maximum likelihood estimate is found by minimizing the least-squares cost. However, because of the complex exponential mapping of the field map, $\psi$, to the acquired signal data $s(t_n)$, the least-squares cost contains multiple local minima as a function of $\psi$. Converging to a local, but not global, minimum may result in a swap of the water and fat signals.

Past works have proposed to overcome the challenge of multiple local minima by constraining the estimate of the $B_0$ field map, $\psi$, to be slowly varying. However, the assumption of a slowly varying $B_0$ field breaks down in regions where the susceptibility distribution changes rapidly, such as at air-tissue interfaces, and in anatomies with irregular geometry, such as the ankle or brachial plexus. Further, assumptions regarding the degree of field map smoothness generally have no physical basis and are chosen empirically rather than based on the anatomy itself.

The $B_0$ field inhomogeneity is composed of disturbances in the magnetic field that are generally caused by the background magnetic field, which is caused by the shim fields and imperfections in the magnet system, and the susceptibility-induced magnetic field, which results from the interaction of the object being imaged with the applied magnetic field. Rapidly varying $B_0$ fields are attributable to the component of the magnetic field that is induced by abrupt changes in the local susceptibility distribution. The susceptibility-induced field, $\psi_s$, can be estimated if the susceptibility distribution, $\chi$, of the object is known, $$\psi_s(k) = \frac{\gamma}{2\pi} B_0 \left( \frac{1}{3} - \frac{k_z^2}{k^H k} \right) \chi(k) \qquad (3)$$

where $\gamma/2\pi$ is the gyromagnetic ratio (i.e., 42.58 MHz/T for $^1$H), $B_0$ is the main magnetic field strength in Tesla, k denotes the k-space location, and $k^H$ is the conjugate transpose of that k-space location. The image domain representation of $\psi_s$ can be calculated by inverse Fourier transform of Eqn. (3).

In the context of chemical shift encoding, an estimate of the susceptibility distribution based on anatomy can be used to estimate the susceptibility-induced field, which can then be used as an object-based initial estimate of the $B_0$ inhomogeneity map. If the initial estimate of the susceptibility-induced field is reasonably accurate, it may serve as a good initialization for current water-fat separation techniques. As will now be described, an approximation of these susceptibility-induced field inhomogeneities, $\psi_s$, is derived using the source images reconstructed from data acquired at different echo times. This estimate of the susceptibility-induced field, $\psi_s$, can then be used to initialize any complex-based water-fat separation, or other chemical species separation, technique.

Figure 1:
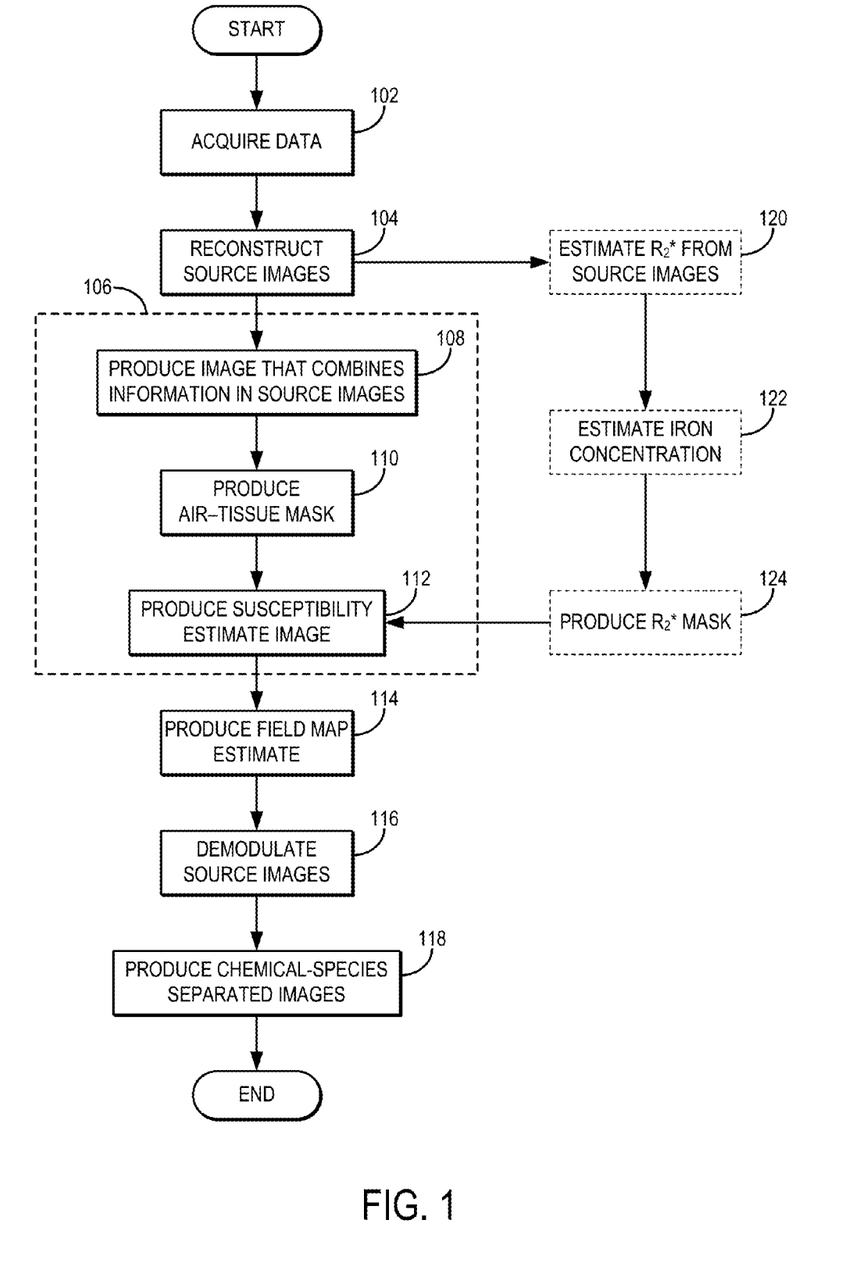
FIG. 1 is a flowchart setting forth the steps of an example of a method for object-based initialization for estimating magnetic field inhomogeneities in chemical species separation MRI.

Referring now to FIG. 1, a flowchart setting forth the steps of an example of a method for object-based initialization for estimating magnetic field inhomogeneities in chemical species separation MRI is illustrated. The method begins with the acquisition of data using the MRI system, as indicated at step 102. Data are acquired by sampling k-space at multiple different echo times. By way of example, multi-echo data can be acquired using a multi-echo 3D spoiled gradient ("SPGR") pulse sequence. From the multi-echo data, source images are reconstructed, as indicated at step 104.

Next, the susceptibility distribution in the subject being imaged is estimated using the source images, as shown generally at 106. By way of example, the susceptibility distribution can be estimated from an image produced using the source images, such as by combining information from the source images, as indicated at step 108. As one example, the susceptibility distribution can be estimated from an image computed as a maximum intensity projection ("MIP") image calculated from the source images by taking the maximum intensity for each pixel, projecting along the echo time dimension. Using the image produced from the source images, a binary mask representing regions of air and tissue can be created, as indicated at step 110. To create the binary mask, an air-tissue threshold can be set at a percent of the maximum value in the average image, such as five percent. Those voxels in the image produced from the source images that are above the threshold can then be considered to contain tissue while those below the threshold are considered to contain air. For the tissue-containing voxels, a mixture of water and fat (e.g., an equal mixture) can be assumed to minimize the maximum error in the estimate of the susceptibility distribution, over all possible water-fat ratios. Under this assumption, the susceptibility value in tissue-containing voxels was set to be the average of the susceptibility values of water and fat. It will be appreciated that other combinations of water and fat (i.e., non-equal mixtures) can also be assumed for different applications.

An estimated susceptibility distribution, $\hat{\chi}$, is then generated from the binary mask, as indicated at step 112. By way of example, the susceptibility distribution is estimated using the known susceptibility values of water, fat, and air, as well as an approximation on the distribution of water and fat.

The estimated susceptibility distribution in the subject is subsequently used to estimate the susceptibility-induced field, $\psi_s$, as indicated at step 114. For instance, the susceptibility-induced field can be calculated using Eqn. (3). The estimate of the susceptibility-induced field is then demodulated from the source images, as indicated at step 116. This demodulation can be performed as follows, $$\hat{s}(t_n) = s(t_n) e^{-2\pi \hat{\psi}_s t_n} \qquad (4).$$

The demodulation step effectively initializes the estimate of the $B_0$ field map with the estimated susceptibility-induced field. The demodulated source images, $\hat{s}(t_n)$, may then be processed using any complex-based chemical species separation technique to produce chemical species separated images, as indicated at step 118. As an example, a water-fat separation technique, such as iterative decomposition of water and fat with echo-asymmetry and least-squares estimation ("IDEAL"), can be used. The methods described here will be particularly useful for so-called two-point separation techniques, in which data are acquired from only two echo times, and are commonly used to image over large, three-dimensional volumes. The limited amount of available data in these methods results in previous methods not being able to accurately and reliably estimate the magnetic field inhomogeneities. With the object-initialized approach of the present invention, however, a robust magnetic field inhomogeneity estimate can be generated even with the more limited data acquired in these two-point methods. By way of a non-limiting example, the method of the present invention can be readily adapted to provide accurate separation of hyperpolarized carbon-13, metabolites containing hyperpolarized carbon-13, hyperpolarized xenon-129, acetone, choline, lactate, and silicone proton magnetic resonance signals. For example, the signal from protons in water, fat, and silicone can all be separated accurately in the same imaging application by way of the method of the present invention.

In the examples described above, assumptions on the magnetic susceptibility distribution are made. For example, the susceptibility distribution is assigned using either the susceptibility value of air or a mixture of water and fat. In general these assumptions should be valid for most situations, unless there is a region of high susceptibility (e.g., a metallic implant or region of high concentrations of iron) in the subject's body. The presence of metallic implants and iron overload will lead to errors in the initial field map estimation and could affect the accuracy of the object-based field map estimate. Thus, in those instances where an anomalous region of susceptibility exists, additional processing can be performed to account for the extreme variations in susceptibility.

Iron is the only naturally occurring substance with high susceptibility that can occur in high concentrations. When pathological iron overload occurs, it typically affects the liver, pancreas, spleen, bone marrow, and occasionally the heart. Accordingly, the concentration of iron can optionally be estimated and incorporated into the estimation of the susceptibility-induced field. To this end, the transverse relaxation rate, $R_2^*$, can optionally be estimated from the source images, as indicated at step 120. From the estimated $R_2^*$ values, the iron concentration in the subject can be estimated, as indicated at step 122. An $R_2^*$ mask can then be produced from the estimated $R_2^*$ values, as indicated at step 124. By way of example, a thresholding procedure can be used to produce the $R_2^*$ mask. The $R_2^*$ mask is then used to assign susceptibility values based on the iron concentrations in the masked areas.

It is noted that the aforementioned optional process to account for the susceptibility effects attributable to iron concentration levels can also be performed for metallic implants. In particular, when a metallic implant is present, a mask image corresponding to the metallic implant can be produced from the source images. This mask image can then be used to assign susceptibility values associated with the material composition of the implant to the susceptibility distribution. Further, a digital representation of the particular metallic implant can also be used to accurately assign susceptibility values to regions in the subject occupied by the implant. For instance, a three-dimensional computer model of the particular implant can be supplied and registered with the source images when estimating the susceptibility distribution. This approach may yield more accurate results than thresholding or otherwise masking the source images to localize the metallic implant, especially if the presence of the metallic implant leads to image distortions.

It is also noted that, because the present invention is capable of obtaining a more robust estimate of the magnetic field inhomogeneities, it may be beneficial to acquire data from the subject without shimming the main magnetic field. The methods described above do not account for the active shimming that is routinely applied prior to the actual scan to achieve a uniform magnetic field. These shims, however, are typically low order and typically linear (i.e., very smoothly varying) and thus can be handled by existing chemical species separation algorithms. It is also contemplated that the present invention can be used to guide shimming algorithms, generally. That is, using the methods described above, an object-based initialization of magnetic field inhomogeneities can be used to guide the shimming process, thereby resulting in a more uniformly shimmed main magnetic field.

In a similar vein, the present invention is also applicable to mitigating phase wraps, such as in neuroimaging applications, such as susceptibility-weighted imaging, such as those described by E. Haacke, et al., in "Susceptibility weighted imaging (SWI)," *Magnetic Resonance in Medicine,* 2004; 52(3):612-618. In these applications, the susceptibility-induced magnetic field map, $\psi_s$, can be demodulated from reconstructed images of the subject to mitigate phase wrapping in those images. After such a demodulation, it is likely that only a small, residual error would remain in the phase measurements. Because the amount of phase wrapping is known, the residual error can be determined and removed from the reconstructed images. As a result, the deleterious effects of phase wrapping can be mitigated. This approach will be particularly advantageous for susceptibility-weighted imaging and quantitative susceptibility mapping applications, such as those described by L. de Rochefort, et al., "Quantitative susceptibility map reconstruction from MR phase data using Bayesian regularization: validation and application to brain imaging," *Magnetic Resonance in Medicine,* 2010; 63(1):194-206.

Figure 2:
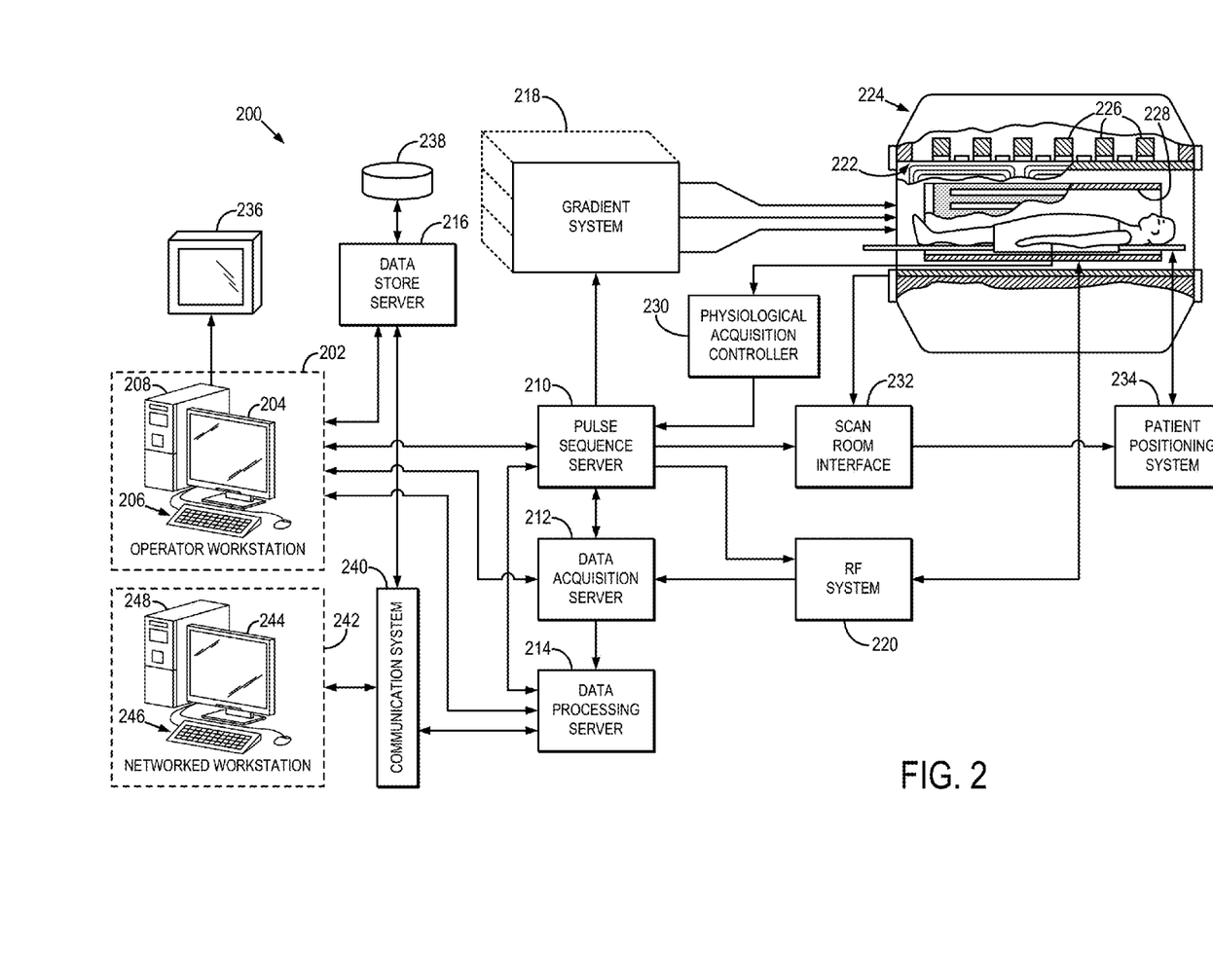
FIG. 2 is a block diagram of an example of a magnetic resonance imaging ("MRI") system.

Referring particularly now to FIG. 2, an example of a magnetic resonance imaging ("MRI") system 200 is illustrated. The MRI system 200 includes a workstation 202 having a display 204 and a keyboard 206. The workstation 202 includes a processor 208, such as a commercially available programmable machine running a commercially available operating system. The workstation 202 provides the operator interface that enables scan prescriptions to be entered into the MRI system 200. The workstation 202 is coupled to four servers: a pulse sequence server 210; a data acquisition server 212; a data processing server 214; and a data store server 216. The workstation 202 and each server 210, 212, 214, and 216 are connected to communicate with each other.

The pulse sequence server 210 functions in response to instructions downloaded from the workstation 202 to operate a gradient system 218 and a radiofrequency ("RF") system 220. Gradient waveforms necessary to perform the prescribed scan are produced and applied to the gradient system 218, which excites gradient coils in an assembly 222 to produce the magnetic field gradients $G_x$, $G_y$, and $G_z$ used for position encoding MR signals. The gradient coil assembly 222 forms part of a magnet assembly 224 that includes a polarizing magnet 226 and a whole-body RF coil 228.

RF excitation waveforms are applied to the RF coil 228, or a separate local coil (not shown in FIG. 2), by the RF system 220 to perform the prescribed magnetic resonance pulse sequence. Responsive MR signals detected by the RF coil 228, or a separate local coil (not shown in FIG. 2), are received by the RF system 220, amplified, demodulated, filtered, and digitized under direction of commands produced by the pulse sequence server 210. The RF system 220 includes an RF transmitter for producing a wide variety of RF pulses used in MR pulse sequences. The RF transmitter is responsive to the scan prescription and direction from the pulse sequence server 210 to produce RF pulses of the desired frequency, phase, and pulse amplitude waveform. The generated RF pulses may be applied to the whole body RF coil 228 or to one or more local coils or coil arrays (not shown in FIG. 2).

The RF system 220 also includes one or more RF receiver channels. Each RF receiver channel includes an RF preamplifier that amplifies the MR signal received by the coil 228 to which it is connected, and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2} \quad (5);$$

and the phase of the received MR signal may also be determined:

$$\varphi = \tan^{-1}\left(\frac{Q}{I}\right). \quad (6)$$

The pulse sequence server 210 also optionally receives patient data from a physiological acquisition controller 230. The controller 230 receives signals from a number of different sensors connected to the patient, such as electrocardiograph ("ECG") signals from electrodes, or respiratory signals from a bellows or other respiratory monitoring device. Such signals are typically used by the pulse sequence server 210 to synchronize, or "gate," the performance of the scan with the subject's heart beat or respiration.

The pulse sequence server 210 also connects to a scan room interface circuit 232 that receives signals from various sensors associated with the condition of the patient and the magnet system. It is also through the scan room interface circuit 232 that a patient positioning system 234 receives commands to move the patient to desired positions during the scan.

The digitized MR signal samples produced by the RF system 220 are received by the data acquisition server 212. The data acquisition server 212 operates in response to instructions downloaded from the workstation 202 to receive the real-time MR data and provide buffer storage, such that no data are lost by data overrun. In some scans, the data acquisition server 212 does little more than pass the acquired MR data to the data processor server 214. However, in scans that require information derived from acquired MR data to control the further performance of the scan, the data acquisition server 212 is programmed to produce such information and convey it to the pulse sequence server 210. For example, during prescans, MR data are acquired and used to calibrate the pulse sequence performed by the pulse sequence server 210. Also, navigator signals may be acquired during a scan and used to adjust the operating parameters of the RF system 220 or the gradient system 218, or to control the view order in which k-space is sampled. In all these examples, the data acquisition server 212 acquires MR data and processes it in real-time to produce information that is used to control the scan.

The data processing server 214 receives MR data from the data acquisition server 212 and processes it in accordance with instructions downloaded from the workstation 202. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 214 are conveyed back to the workstation 202 where they are stored. Real-time images are stored in a data base memory cache (not shown in FIG. 2), from which they may be output to operator display 212 or a display 236 that is located near the magnet assembly 224 for use by attending physicians. Batch mode images or selected real time images are stored in a host database on disc storage 238. When such images have been reconstructed and transferred to storage, the data processing server 214 notifies the data store server 216 on the workstation 202. The workstation 202 may be used by an operator to archive the images, produce films, or send the images via a network to other facilities.

Thus, a new approach that supplements existing chemical shift encoding chemical species separation methods, such as water-fat separation methods, has been described. An initial object-based estimate of the $B_0$ field map is produced and serves as a highly accurate initialization of the $B_0$ field map, which improves the robustness of existing chemical species separation methods. The present invention can be utilized as a preprocessing of reconstructed source images, and therefore can be applicable to any complex-based chemical shift encoding chemical species separation method.

One advantage of the approach described here is that it exploits a physical property of the imaging volume (i.e., susceptibility) rather than relying on arbitrary assumptions of field map smoothness. This method is particularly applicable when imaging regions in which the $B_0$ field map varies rapidly, either due to abrupt changes in the susceptibility distribution or in anatomies with irregular geometry.

In some embodiments, the present invention can be applied to any multi-echo application that attempts to perform estimation of a field map, such as field map estimation of susceptibility-weighted imaging. Susceptibility-weighted imaging applications can often suffer from phase wrapping when attempting to estimate the field map; however, by implementing the present invention, the problems associated with phase wrapping can be mitigated or otherwise avoided for these applications. Further, quantitative susceptibility mapping methods require an accurate estimation of the field inhomogeneity map, prior to dipole inversion, and may benefit from a field map estimation in which problems associated with phase wrapping are mitigated or otherwise removed.

In some embodiments, the present invention can be implemented to use the estimated field map to reduce distortions. In one example, blurring associated with spiral and other non-Cartesian k-space sampling patterns can be reduced. In another example, distortions associated with echo-planar imaging acquisitions can be reduced. In both examples, estimates of the field map can be obtained from the susceptibility distribution without actually measuring a field map with a multi-echo method.

In some embodiments, the present invention can be implemented on k-space data acquired using a single-echo acquisition rather than the multi-echo acquisitions described above. In these embodiments, an approximation of the field map can be generated and used to reduce distortions associated with the magnetic field inhomogeneities. For example, the field map estimate could be used to reduce distortions in diffusion-weighted imaging or echo-planar imaging.

In some embodiments, the present invention can also be implemented for shimming applications. Most shimming routines acquire a multi-echo acquisition to determine the actual field map. Using the field map, the linear or second order shims are then turned on to minimize the average inhomogeneity in a predefined region. With the method of the present invention, however, it is possible to acquire a single image that can then be used to make a mask image as described above. A field map can then be estimated from the object or anatomy based on an assumption of the susceptibility distribution in the object or anatomy. The advantage with this approach is that acquiring a field map takes time (e.g., typically twice the scan time), and has problems with phase aliasing when estimating the underlying field map. The technique described here may be sufficiently accurate for shimming applications and possibly more robust (e.g., there would be no phase aliasing).

The present invention has been described in terms of one or more preferred embodiments, and it should be appreciated that many equivalents, alternatives, variations, and modifications, aside from those expressly stated, are possible and within the scope of the invention.

The invention claimed is:

1. A method for estimating inhomogeneities in a magnetic field of a magnetic resonance imaging (MRI) system, the steps of the method comprising:
 a) directing the MRI system to acquire k-space data from an imaging volume at a plurality of different echo times;
 b) reconstructing an image for each of the plurality of echo times using the k-space data acquired at the respective echo time;
 c) estimating a distribution of magnetic susceptibility values in the imaging volume using information in the images reconstructed in step b);
 d) estimating a magnetic field inhomogeneity map from the distribution of magnetic susceptibility values estimated in step c); and
 wherein step c) includes combining the images reconstructed in step b) and estimating the distribution of magnetic susceptibility values from information in the combined image.

2. The method as recited in claim 1 wherein the combined image is produced by calculating a maximum intensity projection of the reconstructed images with respect to the plurality of echo times.

3. The method as recited in claim 1 wherein step c) includes producing a mask image from the combined image, and assigning magnetic susceptibility values based on pixel values in the mask image.

4. The method as recited in claim 3 wherein the mask image is a binary mask image having one pixel value for regions in the imaging volume that are associated with tissue and another pixel value for regions in the imaging volume that are associated with air.

5. The method as recited in claim 3 wherein the magnetic susceptibility values assigned to regions in the imaging volume that are associated with tissue in step c) are a combination of a magnetic susceptibility value for water and a magnetic susceptibility value for fat.

6. The method as recited in claim 1 further comprising calculating shimming values for a magnetic field of the MRI system using the magnetic field inhomogeneity map estimated in step d).

7. The method as recited in claim 1 further comprising performing a chemical species separation using the magnetic field inhomogeneity map estimated in step d).

8. The method as recited in claim 7 wherein the chemical species separation includes separating signal contributions attributable to water from signal contributions attributable to fat.

9. The method as recited in claim 8 further comprising producing at least one of a water image from the signal contributions attributable to water and a fat image from the signal contributions attributable to fat.

10. The method as recited in claim 7 wherein the chemical species separation includes separating signal contributions attributable to at least two of hyperpolarized carbon-13, metabolites containing hyperpolarized carbon-13, hyperpolarized xenon-129, acetone, choline, lactate, silicone, water, and fat.

11. The method as recited in claim 1 wherein step c) includes estimating transverse relaxation rates in the imaging volume from the images reconstructed in step b), associating the estimated transverse relaxation rates with iron concentrations in the image volume, and assigning magnetic susceptibility values to the magnetic susceptibility distribution based on the iron concentrations.

12. The method as recited in claim 1 wherein step c) includes providing information about a metallic implant depicted in the images reconstructed in step b) and assigning magnetic susceptibility values to the magnetic susceptibility distribution based on the information about the metallic implant.

13. The method as recited in claim 12, wherein providing the information about the metallic implant includes providing a three-dimensional model of the metallic implant.

14. The method as recited in claim 1, further comprising reducing distortions in the images reconstructed in step b) using the magnetic field inhomogeneity map estimated in step d).

15. The method as recited in claim 14, wherein step a) includes acquiring the k-space data by sampling k-space using a non-Cartesian sampling pattern, and the distortions reduced in the reconstructed images are blurring associated with the non-Cartesian sampling pattern.

16. The method as recited in claim 15, wherein the non-Cartesian sampling pattern is a spiral sampling pattern.

17. The method as recited in claim 14, wherein step a) includes acquiring the k-space data using an echo-planar imaging acquisition and the distortions reduced in the reconstructed images are associated with the echo-planar imaging acquisition.

18. A method for estimating inhomogeneities in a magnetic field of a magnetic resonance imaging (MRI) system, the steps of the method comprising
 a) directing the MRI system to acquire k-space data from an imaging volume at a plurality of different echo times;
 b) reconstructing an image for each of the plurality of echo times using the k-space data acquired at the respective echo time;
 c) estimating a distribution of magnetic susceptibility values in the imaging volume using information in the images reconstructed in step b);

d) estimating a magnetic field inhomogeneity map from the distribution of magnetic susceptibility values estimated in step c); and performing a chemical species separation using the magnetic field inhomogeneity map estimated in step d).

19. The method as recited in claim 18 wherein the chemical species separation includes separating signal contributions attributable to water from signal contributions attributable to fat.

20. The method as recited in claim 19 further comprising producing at least one of a water image from the signal contributions attributable to water and a fat image from the signal contributions attributable to fat.

21. The method as recited in claim 18, wherein the chemical species separation includes separating signal contributions attributable to at least two of hyperpolarized carbon-13, metabolites containing hyperpolarized carbon-13, hyperpolarized xenon-129, acetone, choline, lactate, silicone, water, and fat.

22. The method as recited in claim 18 wherein step c) includes combining the images reconstructed in step b) and estimating the distribution of magnetic susceptibility values from information in the combined image.

23. The method as recited in claim 22 wherein the combined image is produced by calculating a maximum intensity projection of the reconstructed images with respect to the plurality of echo times.

24. The method as recited in claim 22 wherein step c) includes producing a mask image from the combined image, and assigning magnetic susceptibility values based on pixel values in the mask image.

25. The method as recited in claim 24 wherein the mask image is a binary mask image having one pixel value for regions in the imaging volume that are associated with tissue and another pixel value for regions in the imaging volume that are associated with air.

26. The method as recited in claim 24 wherein the magnetic susceptibility values assigned to regions in the imaging volume that are associated with tissue in step c) are a combination of a magnetic susceptibility value for water and a magnetic susceptibility value for fat.

27. The method as recited in claim 18 further comprising calculating shimming values for a magnetic field of the MRI system using the magnetic field inhomogeneity map estimated in step d).

28. The method as recited in claim 18 wherein step c) includes estimating transverse relaxation rates in the imaging volume from the images reconstructed in step b), associating the estimated transverse relaxation rates with iron concentrations in the image volume, and assigning magnetic susceptibility values to the magnetic susceptibility distribution based on the iron concentrations.

29. The method as recited in claim 18 wherein step c) includes providing information about a metallic implant depicted in the images reconstructed in step b) and assigning magnetic susceptibility values to the magnetic susceptibility distribution based on the information about the metallic implant.

30. The method as recited in claim 29 wherein providing the information about the metallic implant includes providing a three-dimensional model of the metallic implant.

31. The method as recited in claim 18 further comprising reducing distortions in the images reconstructed in step b) using the magnetic field inhomogeneity map estimated in step d).

32. The method as recited in claim 31 wherein step a) includes acquiring the k-space data by sampling k-space using a non-Cartesian sampling pattern, and the distortions reduced in the reconstructed images are blurring associated with the non-Cartesian sampling pattern.

33. The method as recited in claim 32 wherein the non-Cartesian sampling pattern is a spiral sampling pattern.

34. The method as recited in claim 31 wherein step a) includes acquiring the k-space data using an echo-planar imaging acquisition and the distortions reduced in the reconstructed images are associated with the echo-planar imaging acquisition.

35. A method for estimating inhomogeneities in a magnetic field of a magnetic resonance imaging (MRI) system, the steps of the method comprising:

a) directing the MRI system to acquire k-space data from an imaging volume at a plurality of different echo times;

b) reconstructing an image for each of the plurality of echo times using the k-space data acquired at the respective echo time;

c) estimating a distribution of magnetic susceptibility values in the imaging volume using information in the images reconstructed in step b);

d) estimating a magnetic field inhomogeneity map from the distribution of magnetic susceptibility values estimated in step c); and wherein step c) includes estimating transverse relaxation rates in the imaging volume from the images reconstructed in step b), associating the estimated transverse relaxation rates with iron concentrations in the image volume, and assigning magnetic susceptibility values to the magnetic susceptibility distribution based on the iron concentrations.

36. The method as recited in claim 35 wherein step c) includes combining the images reconstructed in step b) and estimating the distribution of magnetic susceptibility values from information in the combined image.

37. The method as recited in claim 36 wherein the combined image is produced by calculating a maximum intensity projection of the reconstructed images with respect to the plurality of echo times.

38. The method as recited in claim 36 wherein step c) includes producing a mask image from the combined image, and assigning magnetic susceptibility values based on pixel values in the mask image.

39. The method as recited in claim 38 wherein the mask image is a binary mask image having one pixel value for regions in the imaging volume that are associated with tissue and another pixel value for regions in the imaging volume that are associated with air.

40. The method as recited in claim 38 wherein the magnetic susceptibility values assigned to regions in the imaging volume that are associated with tissue in step c) are a combination of a magnetic susceptibility value for water and a magnetic susceptibility value for fat.

41. The method as recited in claim 35 further comprising calculating shimming values for a magnetic field of the MRI system using the magnetic field inhomogeneity map estimated in step d).

42. The method as recited in claim 35 further comprising performing a chemical species separation using the magnetic field inhomogeneity map estimated in step d).

43. The method as recited in claim 42 wherein the chemical species separation includes separating signal contributions attributable to water from signal contributions attributable to fat.

44. The method as recited in claim 43 further comprising producing at least one of a water image from the signal contributions attributable to water and a fat image from the signal contributions attributable to fat.

45. The method as recited in claim 42 wherein the chemical species separation includes separating signal contributions attributable to at least two of hyperpolarized carbon-13, metabolites containing hyperpolarized carbon-13, hyperpolarized xenon-129, acetone, choline, lactate, silicone, water, and fat.

46. The method as recited in claim 35 wherein step c) includes providing information about a metallic implant depicted in the images reconstructed in step b) and assigning magnetic susceptibility values to the magnetic susceptibility distribution based on the information about the metallic implant.

47. The method as recited in claim 46 wherein providing the information about the metallic implant includes providing a three-dimensional model of the metallic implant.

48. The method as recited in claim 35 further comprising reducing distortions in the images reconstructed in step b) using the magnetic field inhomogeneity map estimated in step d).

49. The method as recited in claim 48 wherein step a) includes acquiring the k-space data by sampling k-space using a non-Cartesian sampling pattern, and the distortions reduced in the reconstructed images are blurring associated with the non-Cartesian sampling pattern.

50. The method as recited in claim 49 wherein the non-Cartesian sampling pattern is a spiral sampling pattern.

51. The method as recited in claim 48 wherein step a) includes acquiring the k-space data using an echo-planar imaging acquisition and the distortions reduced in the reconstructed images are associated with the echo-planar imaging acquisition.

52. A method for estimating inhomogeneities in a magnetic field of a magnetic resonance imaging (MRI) system, the steps of the method comprising:
a) directing the MRI system to acquire k-space data from an imaging volume at a plurality of different echo times;
b) reconstructing an image for each of the plurality of echo times using the k-space data acquired at the respective echo time;
c) estimating a distribution of magnetic susceptibility values in the imaging volume using information in the images reconstructed in step b);
d) estimating a magnetic field inhomogeneity map from the distribution of magnetic susceptibility values estimated in step c); and
wherein step c) includes providing information about a metallic implant depicted in the images reconstructed in step b) and assigning magnetic susceptibility values to the magnetic susceptibility distribution based on the information about the metallic implant.

53. The method as recited in claim 52, wherein providing the information about the metallic implant includes providing a three-dimensional model of the metallic implant.

54. The method as recited in claim 52 wherein step c) includes combining the images reconstructed in step b) and estimating the distribution of magnetic susceptibility values from information in the combined image.

55. The method as recited in claim 54 wherein the combined image is produced by calculating a maximum intensity projection of the reconstructed images with respect to the plurality of echo times.

56. The method as recited in claim 54 wherein step c) includes producing a mask image from the combined image, and assigning magnetic susceptibility values based on pixel values in the mask image.

57. The method as recited in claim 56 wherein the mask image is a binary mask image having one pixel value for regions in the imaging volume that are associated with tissue and another pixel value for regions in the imaging volume that are associated with air.

58. The method as recited in claim 56 wherein the magnetic susceptibility values assigned to regions in the imaging volume that are associated with tissue in step c) are a combination of a magnetic susceptibility value for water and a magnetic susceptibility value for fat.

59. The method as recited in claim 52 further comprising calculating shimming values for a magnetic field of the MRI system using the magnetic field inhomogeneity map estimated in step d).

60. The method as recited in claim 52 further comprising performing a chemical species separation using the magnetic field inhomogeneity map estimated in step d).

61. The method as recited in claim 60 wherein the chemical species separation includes separating signal contributions attributable to water from signal contributions attributable to fat.

62. The method as recited in claim 61 further comprising producing at least one of a water image from the signal contributions attributable to water and a fat image from the signal contributions attributable to fat.

63. The method as recited in claim 60 wherein the chemical species separation includes separating signal contributions attributable to at least two of hyperpolarized carbon-13, metabolites containing hyperpolarized carbon-13, hyperpolarized xenon-129, acetone, choline, lactate, silicone, water, and fat.

64. The method as recited in claim 52 wherein step c) includes estimating transverse relaxation rates in the imaging volume from the images reconstructed in step b), associating the estimated transverse relaxation rates with iron concentrations in the image volume, and assigning magnetic susceptibility values to the magnetic susceptibility distribution based on the iron concentrations.

65. The method as recited in claim 52 further comprising reducing distortions in the images reconstructed in step b) using the magnetic field inhomogeneity map estimated in step d).

66. The method as recited in claim 65 wherein step a) includes acquiring the k-space data by sampling k-space using a non-Cartesian sampling pattern, and the distortions reduced in the reconstructed images are blurring associated with the non-Cartesian sampling pattern.

67. The method as recited in claim 65 wherein step a) includes acquiring the k-space data using an echo-planar imaging acquisition and the distortions reduced in the reconstructed images are associated with the echo-planar imaging acquisition.

68. The method as recited in claim 52, wherein the non-Cartesian sampling pattern is a spiral sampling pattern.

69. A method for estimating inhomogeneities in a magnetic field of a magnetic resonance imaging (MRI) system, the steps of the method comprising:
a) directing the MRI system to acquire k-space data from an imaging volume at a plurality of different echo times;
b) reconstructing an image for each of the plurality of echo times using the k-space data acquired at the respective echo time;

c) estimating a distribution of magnetic susceptibility values in the imaging volume using information in the images reconstructed in step b);

d) estimating a magnetic field inhomogeneity map from the distribution of magnetic susceptibility values estimated in step c); and further comprising reducing distortions in the images reconstructed in step b) using the magnetic field inhomogeneity map estimated in step d).

70. The method as recited in claim 69, wherein step a) includes acquiring the k-space data by sampling k-space using a non-Cartesian sampling pattern, and the distortions reduced in the reconstructed images are blurring associated with the non-Cartesian sampling pattern.

71. The method as recited in claim 70, wherein the non-Cartesian sampling pattern is a spiral sampling pattern.

72. The method as recited in claim 69, wherein step a) includes acquiring the k-space data using an echo-planar imaging acquisition and the distortions reduced in the reconstructed images are associated with the echo-planar imaging acquisition.

73. The method as recited in claim 69 wherein step c) includes combining the images reconstructed in step b) and estimating the distribution of magnetic susceptibility values from information in the combined image.

74. The method as recited in claim 73 wherein the combined image is produced by calculating a maximum intensity projection of the reconstructed images with respect to the plurality of echo times.

75. The method as recited in claim 73 wherein step c) includes producing a mask image from the combined image, and assigning magnetic susceptibility values based on pixel values in the mask image.

76. The method as recited in claim 75 wherein the mask image is a binary mask image having one pixel value for regions in the imaging volume that are associated with tissue and another pixel value for regions in the imaging volume that are associated with air.

77. The method as recited in claim 75 wherein the magnetic susceptibility values assigned to regions in the imaging volume that are associated with tissue in step c) are a combination of a magnetic susceptibility value for water and a magnetic susceptibility value for fat.

78. The method as recited in claim 69 further comprising calculating shimming values for a magnetic field of the MRI system using the magnetic field inhomogeneity map estimated in step d).

79. The method as recited in claim 69 further comprising performing a chemical species separation using the magnetic field inhomogeneity map estimated in step d).

80. The method as recited in claim 79 wherein the chemical species separation includes separating signal contributions attributable to water from signal contributions attributable to fat.

81. The method as recited in claim 80 further comprising producing at least one of a water image from the signal contributions attributable to water and a fat image from the signal contributions attributable to fat.

82. The method as recited in claim 80 wherein the chemical species separation includes separating signal contributions attributable to at least two of hyperpolarized carbon-13, metabolites containing hyperpolarized carbon-13, hyperpolarized xenon-129, acetone, choline, lactate, silicone, water, and fat.

83. The method as recited in claim 69 wherein step c) includes estimating transverse relaxation rates in the imaging volume from the images reconstructed in step b), associating the estimated transverse relaxation rates with iron concentrations in the image volume, and assigning magnetic susceptibility values to the magnetic susceptibility distribution based on the iron concentrations.

84. The method as recited in claim 69 wherein step c) includes providing information about a metallic implant depicted in the images reconstructed in step b) and assigning magnetic susceptibility values to the magnetic susceptibility distribution based on the information about the metallic implant.

85. The method as recited in claim 84 wherein providing the information about the metallic implant includes providing a three-dimensional model of the metallic implant.

86. A method for estimating inhomogeneities in a magnetic field of a magnetic resonance imaging (MRI) system, the steps of the method comprising:

a) directing the MRI system to acquire k-space data from an imaging volume;

b) reconstructing an image from the acquired k-space data;

c) estimating a distribution of magnetic susceptibility values in the imaging volume using information in the image reconstructed in step b);

d) estimating a magnetic field inhomogeneity map from the distribution of magnetic susceptibility values estimated in step c); and wherein the k-space data acquired in step a) is single-echo k-space data.

87. The method as recited in claim 86, further comprising calculating shimming values for a magnetic field of the MRI system using the magnetic field inhomogeneity map estimated in step d).

* * * * *